US007075472B1

(12) United States Patent
Hsueh

(10) Patent No.: US 7,075,472 B1
(45) Date of Patent: Jul. 11, 2006

(54) AVERAGING ANALOG-TO-DIGITAL CONVERTER WITH SHARED CAPACITOR NETWORK

(75) Inventor: Fu-Lung Hsueh, Cranbury, NJ (US)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 0 days.

(21) Appl. No.: 11/180,934

(22) Filed: Jul. 13, 2005

(51) Int. Cl.
*H03M 1/12* (2006.01)
(52) U.S. Cl. .................................. 341/156; 341/155
(58) Field of Classification Search ......... 341/130–170
See application file for complete search history.

(56) References Cited

U.S. PATENT DOCUMENTS

| | | | |
|---|---|---|---|
| 6,169,508 B1 * | 1/2001 | Edwards | 341/150 |
| 6,885,396 B1 * | 4/2005 | Panicacci et al. | 341/172 |
| 6,954,169 B1 * | 10/2005 | Min | 341/151 |

\* cited by examiner

*Primary Examiner*—Lam T. Mai
(74) *Attorney, Agent, or Firm*—Preston Gates & Ellis LLP

(57) ABSTRACT

An analog-to-digital converter has one or more first stage comparators for generating a set of first stage comparator digital outputs, and a set of first stage comparator analog outputs upon comparing a voltage input with a set of voltage references, a switch network for selectively controlling the first stage comparator analog outputs to pass, a ratio capacitor network shared by the first stage comparators for receiving the first stage comparator analog outputs and providing a second set of intermediate analog outputs for identifying a level of the voltage input among a set of intermediate voltage levels between two voltage references, a number of second stage comparators for outputting the number of second stage comparator digital outputs, and a decoder subsystem for receiving the second stage comparator digital outputs to produce a bits of least significant bits. The ratio capacitor network is shared by more than two first stage comparators.

17 Claims, 3 Drawing Sheets

AVERAGING ANALOG-TO-DIGITAL CONVERTER WITH SHARED CAPACITOR NETWORK

BACKGROUND

The present invention relates generally to integrated circuit designs, and more particularly to methods for implementing averaging flash analog signal to digital signal converters (ADCs) that utilize shared capacitor networks.

Analog-to-Digital converters (ADC) have been in use in various engineering solutions, and are keys to the quality and speed of many electronic systems. Various analog-to-digital conversion techniques exist, and they vary in complexity and speed of conversion. Some of these techniques are sigma-delta ADC and pipeline ADC. One of the fastest and most commonly used types of ADC is the "FLASH" ADC. It utilizes comparators to compare the input signal level with each of the possible quantization levels. The outputs of the comparators are processed by an encoding logic block to provide the number of bits of the output digital word. An example of a flash ADC such as an averaging flash ADC, uses ratio-capacitor networks to average the coarse comparator output for a second step second stage comparison. Such a flash ADC has many advantages. A flash ADC has a high bandwidth, little intrinsic delays, and is relatively easy to design, and can perform fast analog-to-digital conversions. With flash ADC, a complete conversion can be obtained within one clock cycle.

However, conventional circuit designs of flash ADC such as an averaging flash ADC are typically composed of large component counts leading to large physical size. For example, a conventional 8-bit averaging flash ADC uses a 2^N method to determine the number of ratio-capacitors and second stage comparators used for an N-bit ADC. For a simple 8-bit ADC, 256 ratio-capacitors and 256 second stage comparators will be required which take up a large amount of space. The high number of components and large physical size can also create problems such as higher power consumption and production cost. The large number of comparators can also add a huge capacitive load to the analog input signal, thereby limiting the input signal bandwidth.

It is therefore desirable to have an improved flash ADC circuit design that can reduce component counts and physical size of the circuit.

SUMMARY

In view of the foregoing, this invention provides methods and circuits for improving an averaging analog-to-digital converter (ADC) performance by having groups of comparators share ratio-capacitor networks in the second-step comparison to lower the number of second stage comparators.

In one example, the converter has one or more first stage comparators for generating a first set of first stage comparator digital outputs, and a set of first stage comparator analog outputs upon comparing a voltage input with a set of voltage references, a switch network for selectively controlling the first stage comparator analog outputs to pass, a ratio capacitor network shared by the first stage comparators for receiving the first stage comparator analog outputs. It also provides a second set of intermediate analog outputs for identifying a predetermined level of the voltage input among a set of intermediate voltage levels between two predetermined voltage references, a predetermined number of second stage comparators for outputting the predetermined number of second stage comparator digital outputs, and a decoder subsystem for receiving the second stage comparator digital outputs to produce a predetermined bits of least significant bits (LSB), wherein the ratio capacitor network is shared by more than two first stage comparators.

The construction and method of operation of the invention, however, together with additional objects and advantages thereof will be best understood from the following description of specific embodiments when read in connection with the accompanying drawings.

DESCRIPTION

The present invention provides a detailed description of the methods and circuits for an averaging ADC with shared capacitor networks.

Figure 1:
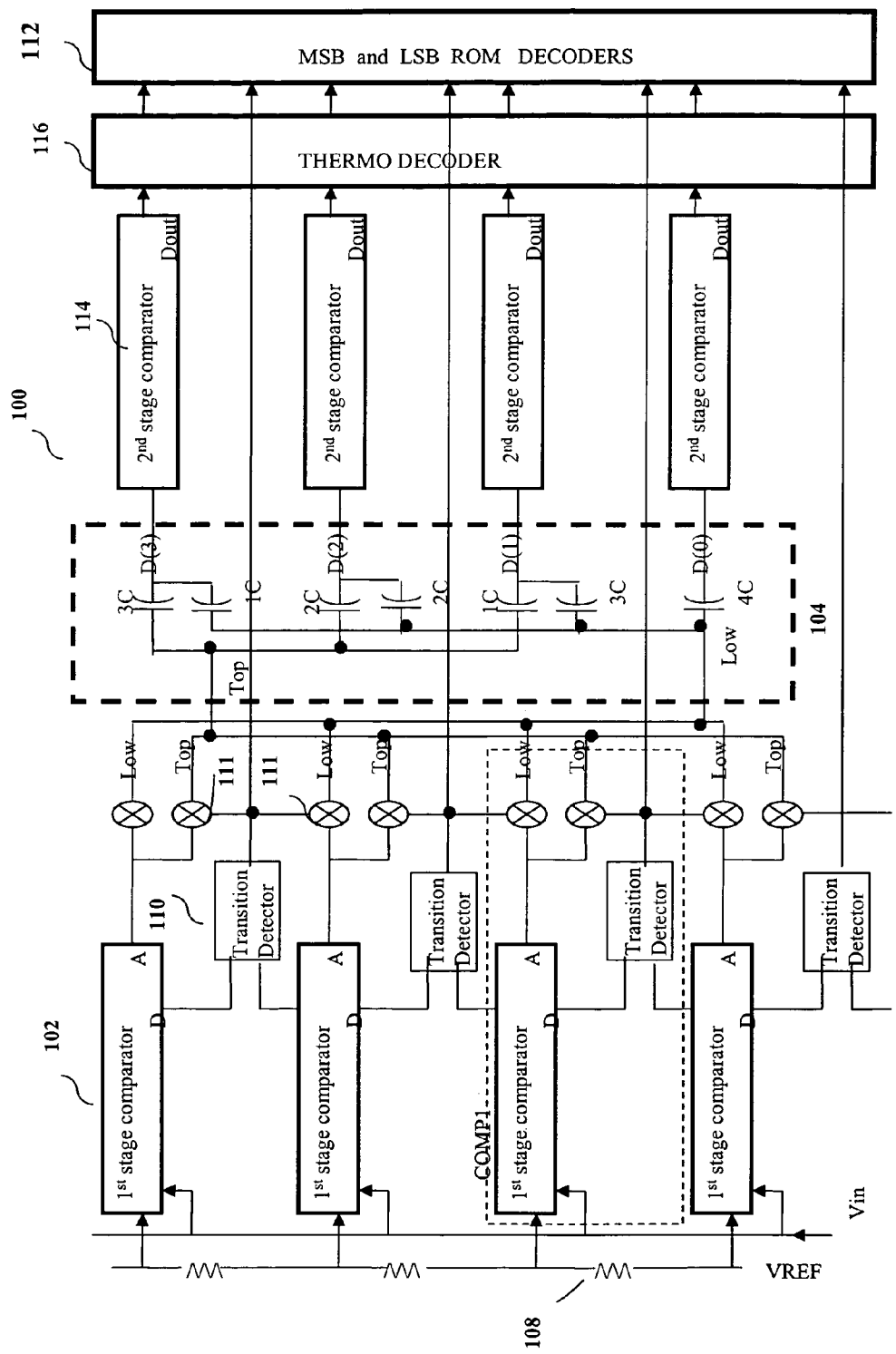
FIG. 1 illustrates an averaging flash ADC in accordance with the first embodiment of the present invention.

FIG. 1 illustrates an ADC 100 showing one-sixteenth of an 8-bit averaging flash ADC in accordance with the first embodiment of the present invention. 64 first stage comparators 102, which are grouped into 16 subgroups, are used with a ratio-4 capacitor network 104. Each first stage comparator 102 of the ADC 100 takes in an input analog signal Vin and a reference voltage Vref. The analog input signal Vin is supplied through an input line 106 that is connected to all 64 first stage comparators 102. One or more reference voltages (Vref) are generated by a reference resistor ladder (not shown) and supplied as input to all 64 first stage comparators 102 through the Vref line 108 like a traditional voltage divider. Each first-step comparator 102 compares the input analog signal Vin to its specific reference voltage Vref and generates a high signal at an analog output "A" when the analog input signal Vin is higher than its reference voltage Vref. If the analog input signal Vin is less than the comparator's reference voltage Vref, the comparator generates a low analog output. The comparators also have digital outputs which are sent to a plurality of transition detectors 110 where each transition detector 110 provides an output for controlling the switches it is coupled to, and further for controlling a decoder subsystem which may include the MSB and LSB ROM decoders 112. It is understood that the decoder subsystem can be designed in various ways. For example, the decoder subsystem can include a thermo decoder 116 to operate with the LSB ROM decoder 112. The MSB decoder can be separate from the LSB ROM decoder, but they may be combined together. The transition detectors along with their coupled switches passing and storing the top and low outputs can be viewed as a switch network. For example, an XOR can be used as the transition detector. Each transition detector is coupled to two comparators, and as graphically illustrated, one comparator shown above it and another below it. For illustration purposes, the one above it is referred to as an upper comparator, and the one below it is referred to as one lower comparator. It is understood that in actual design, the relative locations of the comparators and the transition detector are irrelevant. When the transition detector generates a "1" on its output, the analog output of the lower comparator is passed to the "low"

terminal of capacitor network 104, and the analog output of the upper comparator is passed to the "top" terminal of the capacitor network.

As shown, the analog outputs of the first stage comparators 102 are distributed to the capacitors within the ratio-4 capacitor network 104, which is comprised of seven capacitors in this case and outputs to four second stage comparators 114, which can also be seen as four second stage comparators. It is understood that the capacitors in the ratio-4 capacitor network are fabricated such that if the capacitor at the bottom of the page has a capacitance of 4 C, each capacitor pair above it have a total capacitance of 4C. For example, the capacitors connecting to the low line from the bottom of the page to the top of the page will have 3C, 2C, and 1C respectively, while the capacitors connecting to the top line will have the reverse order, i.e., 1C, 2C, and 3C. These ratios may be accurately maintained using one of many currently available semiconductor fabrication processes which allow relative capacitance to be closely controlled.

Through the shared ratio-4 capacitor network, each second stage comparator receives charges from the top and low terminals. A summation is obtained at the input of the second stage comparator. For example, as illustrated, the first pair of capacitors at the bottom that provides an output D(1) that is a summed signal with ¾ of it from the low terminal and ¼ from the top terminal corresponding to low/top capacitor ratio of 3:1. Similarly, for the second pair of capacitors, it generates an output D(2) that is a summed signal with 2/4 from the low terminal and 2/4 from the top terminal corresponding to a low/top capacitor ratio of 2:2. For the intermediate output D(3), it is the summed signal with ¼ from the low terminal and ¾ from the top terminal corresponding to low/top capacitor ratio of 1:3.

The function of the second stage comparators and the shared capacitor network is to further identify the level of the input with regard to the reference voltages so that a "finer" output can be generated. For illustration purposes, assuming the input signal is above ¼ level between two Vref levels of two first stage comparators, D(1) will have a positive voltage level feeding into its coupled second stage comparator to generate a high or "1" output. In the meantime, D(2) and D(3) are set at negative voltage levels for their corresponding second stage comparators to generate a low or "0" output. Similarly, if the input signal is above ½ level between the two Vref levels of the two first stage comparators, D(1) and D(2) will be at positive voltage levels for their coupled second stage comparators to generate "1" output, while D(3) is at a negative voltage level for its second stage comparator to generate a "0" output. When the input signal is above ¾ level between the two Vref levels of the first stage comparators, D(1), D(2), and D(3) are at positive voltage levels for three of the second stage comparators to generate "1" output. It is understood that the voltage levels of D(0) to D(3) are functions of the input voltage level between two Vref voltage levels of the first stage comparators. In essence, the sharing of the capacitor network and the switch network allows the determination of the level of the Vin against a set of intermediate levels between any two Vref levels. As a result, the intermediate outputs from the capacitor network help to provide the LSB of the final output data.

Unlike some conventional implementation in which every two comparators have to share one capacitor network, the present invention allows more comparators to share a single capacitor network. In this example, since the four first stage comparators 102 share one ratio-4 capacitor network 104, only 16 ratio-4 capacitor networks 104 are necessary for all 64 first stage comparators 102. In addition, only 64 second stage comparators 114 are necessary. For every four first stage comparators, with the second stage comparators 114 and the ratio-4 capacitor network 104, four digital outputs from four of the second stage comparators are sent to the decoder subsystem which may include a thermo decoder 116 that generates a thermometer code. A thermometer code output is a sequence of the bits in which each bit is consecutively asserted, beginning with the LSB to the MSB. The thermometer code generated by the comparators is then converted to a binary digital signal via the MSB and LSB ROM decoder 112. MSB and LSB ROM decoder 112 can select the outputs in order from the LSB to the MSB and output the bits as an 8-bit binary digital code representing the binary value of the analog input signal Vin.

Unlike the conventional 8-bit averaging flash ADC, this embodiment improves the design by grouping four first stage comparators 102 to share a ratio-4 capacitor network 104. As such, the number of comparators is reduced from 256 to 64 for the second stage, thereby greatly reducing the physical size of the circuit and hence reduces total current consumption.

Figure 2:
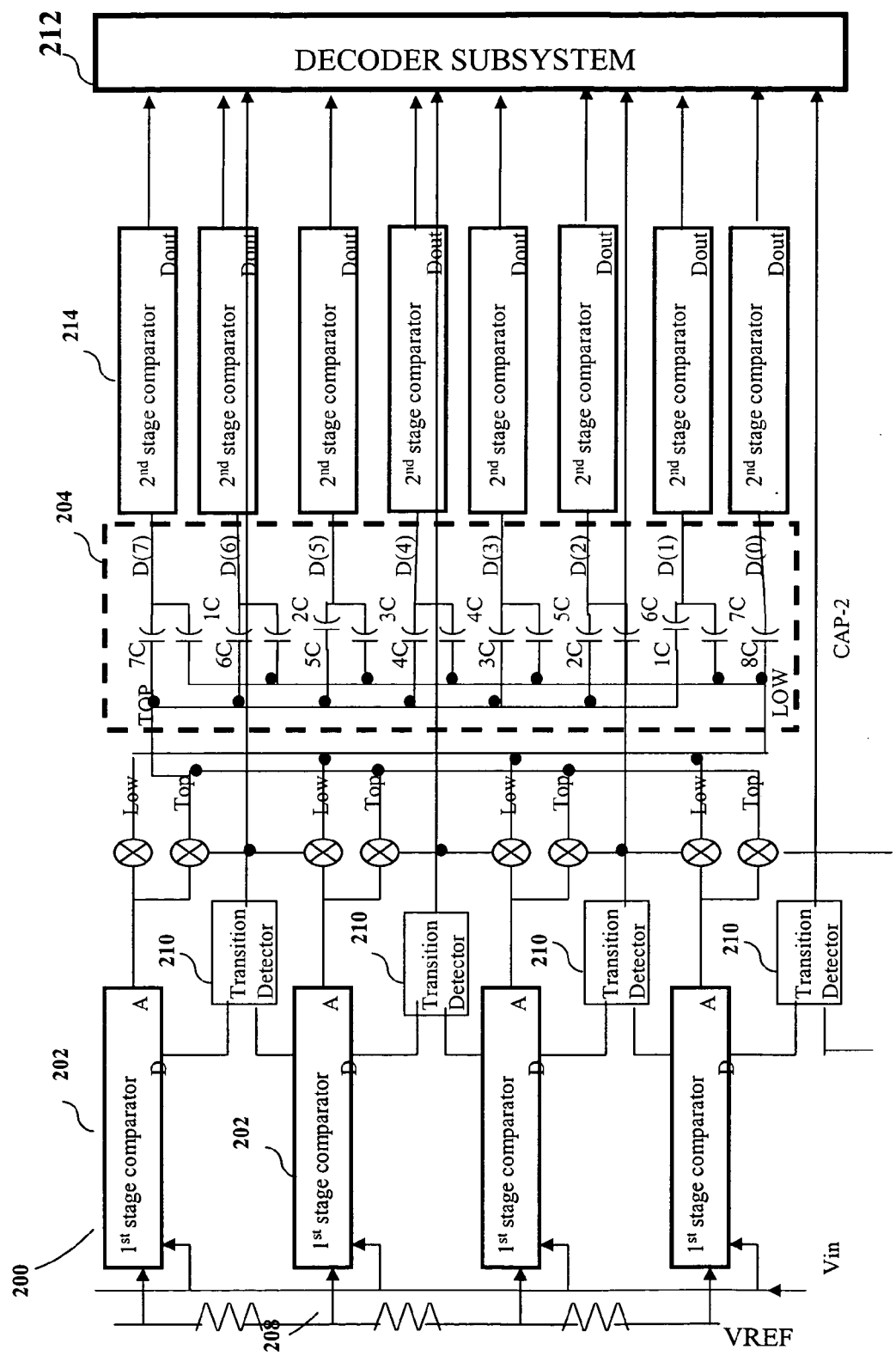
FIG. 2 illustrates an averaging flash ADC in accordance with the second embodiment of the present invention.

FIG. 2 illustrates an ADC 200 showing one-eighth of an 8-bit averaging flash ADC in accordance with the second embodiment of the present invention. The 32 first stage comparators 202 are grouped into 8 subgroups.

Each first stage comparator 202 of the ADC 200 takes in an analog input signal Vin and a reference voltage Vref. The analog input signal Vin is supplied through an input line 206 that is connected to all 32 first stage comparators 202. Reference voltages (Vref) are generated by a reference resistor ladder as inputs to all 32 first stage comparators 202 through a Vref line 208 that acts similar to a traditional voltage divider. Each first-step comparator 202 compares the input analog signal Vin to its specific reference voltage Vref and generates a high analog output when the analog input signal Vin is higher than its reference voltage Vref. If the analog input signal Vin is less than the comparator's reference voltage Vref, the comparator generates a low analog output. The digital outputs from the first stage comparators 202 are sent to the transition detectors 210 where each transition detector 210 provides an output for the decoder subsystem 212.

Meanwhile, the analog outputs of the first stage comparators 202 are distributed to the top and low terminals of the capacitors within a ratio-8 capacitor network 204. Each ratio-8 capacitor network 204 includes fifteen capacitors and it takes in one set of high and low analog signals from two of the first stage comparators 202 before outputting to four second stage comparators or second stage comparators 214. Since four first stage comparators 202 share one ratio-8 capacitor network 204, only 8 ratio-8 capacitor networks 204 are necessary for all 32 first stage comparators 202. With only 8 ratio-8 capacitor networks 204 and 8 outputs for each ratio-8 capacitor network 204, only 64 second stage comparators 214 are necessary. After the second stage comparators 214 compare the signals from the ratio-8 capacitor network 204, an output is sent to the decoder subsystem 212 which may further include a thermo decoder that generates a thermometer code. A thermometer code output is a sequence of the bits in which each bits are consecutively asserted, beginning with the LSB to the MSB. The thermometer code generated is then converted to a binary digital signal by the decoder subsystem which may further include a MSB and a LSB ROM decoder. The decoder subsystem 212 can select the outputs in order from the LSB to the MSB, and output the bits as an 8-bit binary digital code representing the binary value of the analog input signal Vin.

Unlike the conventional 8-bit averaging flash ADC, by grouping four first stage comparators 202 to share a ratio-8 capacitor network 204, the number of second stage comparators 214 in this embodiment is reduced from 256 to 64, thereby greatly reducing the physical size of the circuit and hence reducing total current consumption.

Figure 3:
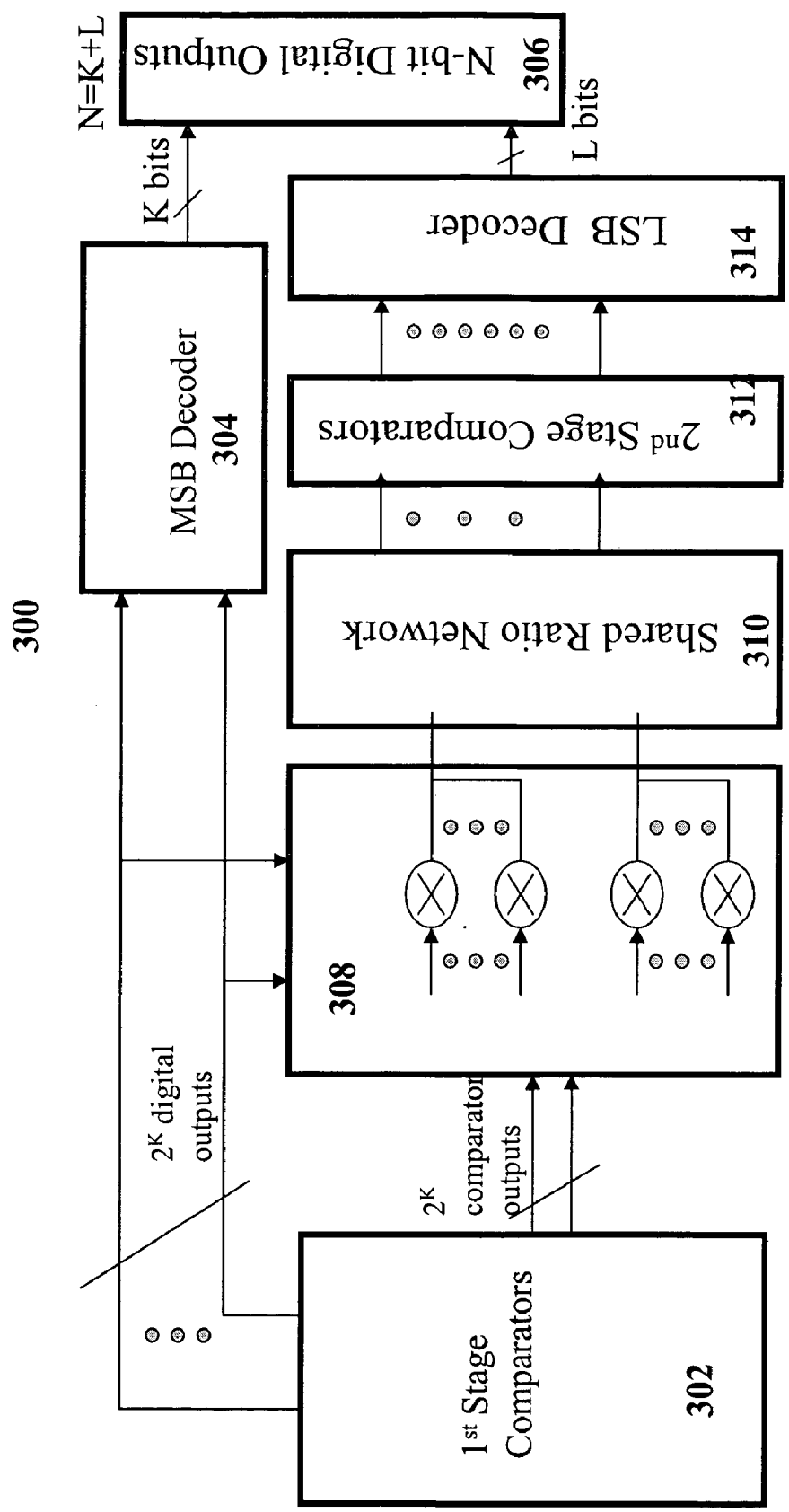
FIG. 3 illustrates an averaging N-bit flash ADC with a shared ratio capacitor network.

FIG. 3 summarizes an overall configuration according to one embodiment of the present invention. It illustrates an averaging N-bit flash ADC 300 with a shared ratio capacitor network. A K-bit primary flash ADC module within a N-bit flash ADC generates two routes. After the first stage of comparators 302, $2^K$ digital outputs are generated to a MSB decoder 304, which produces k bits of MSB data to feed the N bit digital output circuit 306. The other route has $2^K$ comparator analog outputs going into a switch network 308 and further into a shared ratio capacitor network 310 for L bits interpolation or level detection, where L=N−K, so that L bits of the LSB can be generated. With the capacitor network performing the level detection function, a set of second stage comparators 312 do the second stage comparison and provides the output L bits of the LSB to the LSB decoder 314 and which in turn provides input to the digital output circuit 306. The MSB decoder 304 and the LSB decoder 312 can be viewed as a decoder subsystem. The insertion of the shared ratio capacitor network 310 provides tremendous space saving advantage and other associated advantages.

It is further understood by one skilled in the art that although two different ratio-capacitor networks are illustrated in the above embodiments, there are many other ratio-capacitor networks that can be used. For example, A ratio-4 capacitor network can use capacitors with a ratio of 4:0, 3:1, 2:2, and 1:3 for a 2-bit LSB conversion. Similarly, for a ratio-8 capacitor network, the ratio can be 8:0, 7:1, 6:2, 5:3, 4:4, 3:5, 2:6, and 1:7 for a 3-bit LSB conversion. What kind of ratio capacitor network should be used is dependent on how many levels between two reference voltages need to be identified. It is further noted that the sharing of the capacitor network allows the ADC to identify a voltage level of Vin between two reference voltages by comparing it against multiple equally divided fine intermediate levels.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. An averaging analog-to-digital converter comprising:
one or more first stage comparators for generating $2^K$ first stage comparator digital outputs, and $2^K$ first stage comparator analog outputs upon comparing a voltage input with a set of voltage references;
a switch network for selectively controlling the first stage comparator analog outputs to pass;
a ratio capacitor network shared by the first stage comparators for receiving the first stage comparator analog outputs and providing $2^L$ number of intermediate analog outputs for identifying a predetermined level of the voltage input among $2^L$ of intermediate voltage levels between two predetermined voltage references;
$2^L$ number of second stage comparators for outputting $2^L$ number of second stage comparator digital outputs; and
a decoder subsystem for receiving the second stage comparator digital outputs to produce L bits of least significant bits (LSB),
wherein more than two first stage comparators are grouped to share the ratio capacitor network.

2. The converter of claim 1 further comprising a second decoder subsystem for decoding K bits of most significant bits (MSB) from the $2^K$ first stage comparator digital outputs.

3. The converter of claim 1 wherein the switch network further includes:
one or more transition detectors each receiving at least two first stage comparator digital outputs and generating a control signal; and
one or more switches controlled by the control signal for passing the first stage comparator analog outputs.

4. The converter of claim 3 wherein the transition detector is an XOR gate.

5. The converter of claim 1 wherein the capacitor network has a first input terminal and a second input terminal, and $2^L$ capacitor pairs coupled to the first and second input terminals at their first ends and to the intermediate analog output at their second ends.

6. The converter of claim 5 wherein the $2^L$ capacitor pairs each have a predetermined ratio between capacitances thereof so that the intermediate analog outputs identifies a predetermined level of the voltage input among $2^L$ of intermediate voltage levels between two predetermined voltage references.

7. The converter of claim 1 wherein the decoder subsystem further includes a thermo decoder for producing a predetermined thermo code for identifying the LSB.

8. An averaging analog-to-digital converter comprising:
one or more first stage comparator means for generating $2^K$ first stage comparator digital outputs, and $2^K$ first stage comparator analog outputs upon comparing a voltage input with a set of voltage references;
a switch controlling means for selectively controlling the first stage comparator analog outputs to pass;
a level detection means shared by the first stage comparators for receiving the first stage comparator analog outputs and providing $2^L$ number of intermediate analog outputs for identifying a predetermined level of the voltage input among $2^L$ of intermediate voltage levels between two predetermined voltage references;
$2^L$ number of second stage comparator means for outputting $2^L$ number of second stage comparator digital outputs;
a decoder means for receiving the second stage comparator digital outputs to produce L bits of least significant bits (LSB); and
a second decoder for decoding K bits of most significant bits (MSB) from the $2^K$ first stage comparator digital outputs,
wherein the level detection means is shared by more than two first stage comparator means.

9. The converter of claim 8 wherein the switch controlling means further includes:

one or more transition detectors each receiving at least two first stage comparator digital outputs and generating a control signal; and one or more switches controlled by the control signal for passing the first stage comparator analog outputs.

10. The converter of claim 9 wherein the transition detector is an XOR gate.

11. The converter of claim 8 wherein the capacitor network has a first input terminal and a second input terminal, and $2^L$ capacitor pairs coupled to the first and second input terminals at their first ends and to the intermediate analog output at their second ends.

12. The converter of claim 11 wherein the $2^L$ capacitor pairs each have a predetermined ratio between capacitances thereof so that the intermediate analog outputs identifies a predetermined level of the voltage input among $2^L$ of intermediate voltage levels between two predetermined voltage references.

13. The converter of claim 8 wherein the decoder means further includes a thermo decoder for producing a predetermined thermo code for identifying the LSB.

14. An averaging analog-to-digital converter comprising:
one or more first stage comparators for generating a first set of first stage comparator digital outputs, and a first set of first stage comparator analog outputs upon comparing a voltage input with a set of voltage references;

a switch network for selectively controlling the first stage comparator analog outputs to pass with one or more transition detectors each receiving at least two first stage comparator digital outputs and generating a control signal; and one or more switches controlled by the control signal for selectively passing the first stage comparator analog outputs;

a ratio capacitor network shared by the first stage comparators for receiving the first stage comparator analog outputs passed onto its two input terminals and providing a predetermined number of intermediate analog outputs for identifying a predetermined level of the voltage input based on one or more intermediate voltage levels between two predetermined voltage references;

one or more second stage comparators each coupled to an intermediate analog outputs for outputting second stage comparator digital outputs;

a decoder subsystem for receiving the second stage comparator digital outputs to produce a predetermined number of least significant bits (LSB); and a second decoder subsystem for decoding a predetermined number of most significant bits (MSB) from the first stage comparator digital outputs, wherein the ratio capacitor network is shared by more than two first stage comparators.

15. The converter of claim 14 wherein the transition detector is an XOR gate.

16. The converter of claim 14 wherein the capacitor network has a predetermined capacitor pairs coupled to the two input terminals and each have a predetermined ratio between two capacitances thereof so that the intermediate analog outputs identifies a predetermined level of the voltage input based on a predetermined number of intermediate voltage levels between two predetermined voltage references.

17. The converter of claim 14 wherein the decoder subsystem further includes a thermo decoder for producing a predetermined thermo code for identifying the LSB.

* * * * *